United States Patent
Narasimhan et al.

(10) Patent No.: US 9,537,024 B2
(45) Date of Patent: Jan. 3, 2017

(54) METAL-DIELECTRIC HYBRID SURFACES AS INTEGRATED OPTOELECTRONIC INTERFACES

(71) Applicant: The Board of Trustees of the Leland Stanford Junior University, Palo Alto, CA (US)

(72) Inventors: Vijay K. Narasimhan, Stanford, CA (US); Thomas M. Hymel, Stanford, CA (US); Ruby A. Lai, Stanford, CA (US); Yi Cui, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 15/142,851

(22) Filed: Apr. 29, 2016

(65) Prior Publication Data
US 2016/0322517 A1    Nov. 3, 2016

Related U.S. Application Data

(60) Provisional application No. 62/155,396, filed on Apr. 30, 2015.

(51) Int. Cl.
*H04B 5/00* (2006.01)
*H01L 31/0232* (2014.01)
*H01L 33/38* (2010.01)
*H01L 33/44* (2010.01)
*H01L 31/0216* (2014.01)
(Continued)

(52) U.S. Cl.
CPC ..... *H01L 31/02327* (2013.01); *H01L 31/0224* (2013.01); *H01L 31/02161* (2013.01); *H01L 31/02168* (2013.01); *H01L 31/02366* (2013.01); *H01L 31/022425* (2013.01); *H01L 31/0687* (2013.01); *H01L 31/0725* (2013.01);
(Continued)

(58) Field of Classification Search
CPC ............... G06K 19/07749; G06K 19/0723; G06K 19/0726; G06K 19/07771; G06K 7/0008; H01Q 1/2225; H01Q 9/0414; H01Q 13/02; H01Q 13/106; H01Q 13/18; H01Q 15/16; H01Q 19/106; H01Q 19/132; H01Q 1/22
USPC ....... 343/700 MS, 873, 911 R, 572.1, 572.4, 343/572.7, 572.8; 977/773, 948
See application file for complete search history.

(56) References Cited

U.S. PATENT DOCUMENTS

| | | | | |
|---|---|---|---|---|
| 6,329,915 B1* | 12/2001 | Brady | ................ | G06K 7/0008 340/572.1 |
| 2011/0037541 A1* | 2/2011 | Johnson | ............. | G06K 19/0726 333/219.1 |

(Continued)

OTHER PUBLICATIONS

Liu et al., "Enhanced Optical Transmission through MacEtch-Fabricated Buried Metal Gratings," Adv. Mater., 28: 1441-1448, Dec. 8, 2015.

*Primary Examiner* — Stephen W Smoot
*Assistant Examiner* — Edwin Chin
(74) *Attorney, Agent, or Firm* — Lumen Patent Firm

(57) ABSTRACT

An optoelectronic device has a hybrid metal-dielectric optoelectronic interface including an array of nanoscale dielectric resonant elements (e.g., nanopillars), and a metal film disposed between the dielectric resonant elements and below a top surface of the resonant elements such that the dielectric resonant elements protrude through the metal film. The device may also include an anti-reflection coating. The device may further include a metal film layer on each of the dielectric resonant elements.

8 Claims, 16 Drawing Sheets

(51) Int. Cl.
*H01L 31/0687* (2012.01)
*H01L 31/0725* (2012.01)
*H01L 31/0236* (2006.01)
*H01L 31/0224* (2006.01)

(52) U.S. Cl.
CPC .............. *H01L 33/38* (2013.01); *H01L 33/44* (2013.01); *H01L 2933/0016* (2013.01)

(56) References Cited

U.S. PATENT DOCUMENTS

| | | | |
|---|---|---|---|
| 2011/0248891 A1* | 10/2011 | Han | H01Q 1/40 343/700 MS |
| 2012/0060913 A1* | 3/2012 | Grandidier | B82Y 30/00 136/256 |
| 2013/0088396 A1* | 4/2013 | Han | H01Q 9/04 343/700 MS |
| 2014/0050486 A1* | 2/2014 | Bain | H04B 5/00 398/118 |

* cited by examiner

Unetched

Etched

*Fig. 7A*
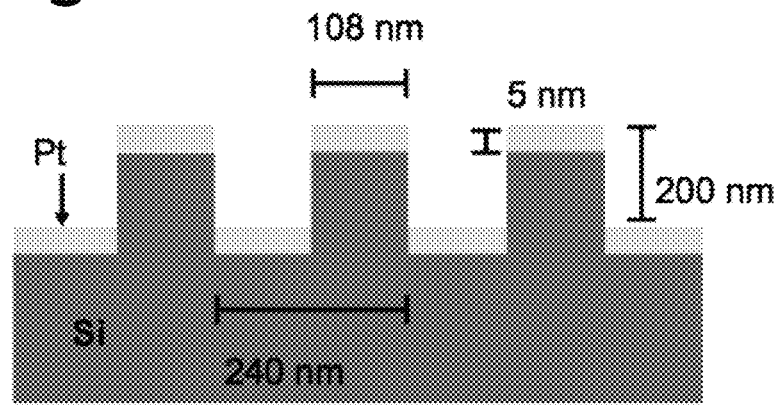
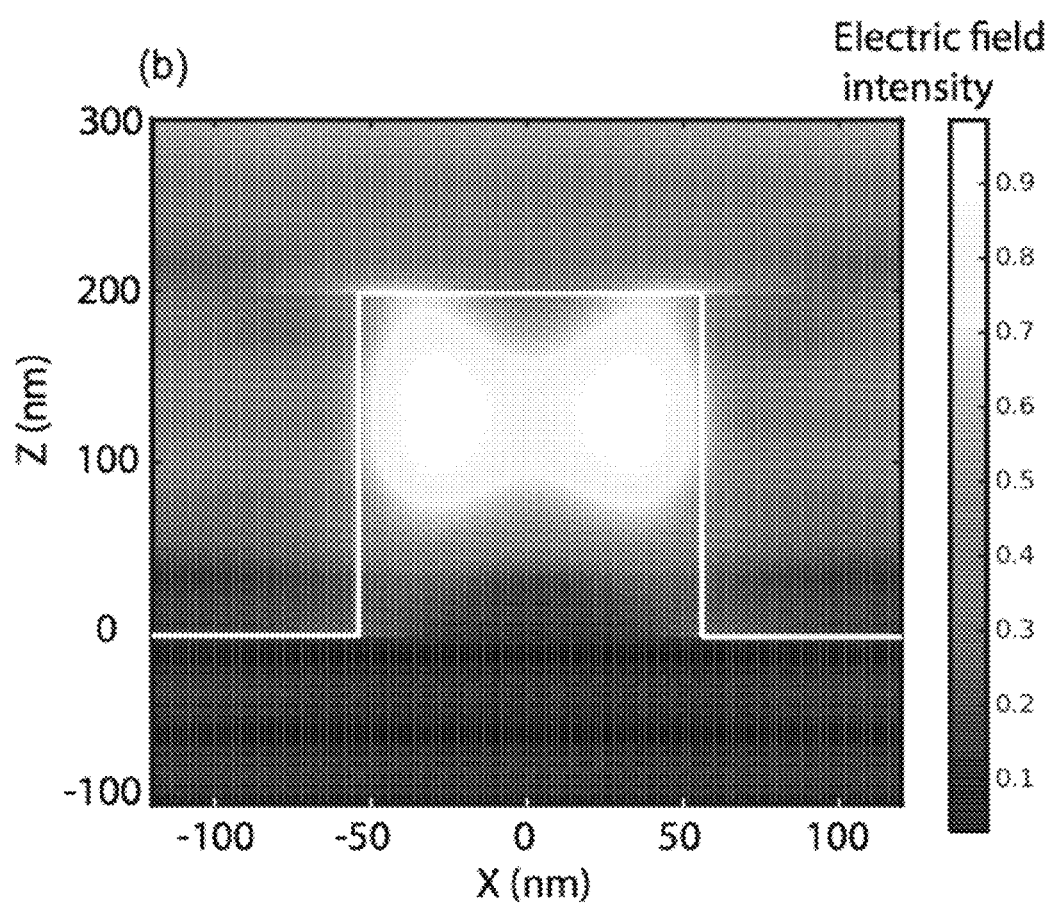
*Fig. 7B*

METAL-DIELECTRIC HYBRID SURFACES AS INTEGRATED OPTOELECTRONIC INTERFACES

CROSS-REFERENCE TO RELATED APPLICATIONS

This application claims priority from U.S. Provisional Patent Application 62/155,396 filed Apr. 30, 2015, which is incorporated herein by reference.

STATEMENT OF GOVERNMENT SPONSORED SUPPORT

This invention was made with Government support under contract DE-EE0004946 awarded by the Department of Energy. The Government has certain rights in the invention.

FIELD OF THE INVENTION

The present invention relates generally to optoelectronic devices such as photovoltaic devices, photosensors, and light-emitting diodes (LEDs). More specifically, it relates to an improved optoelectronic interface for such devices.

BACKGROUND OF THE INVENTION

A variety of nanostructured surfaces, including nanopillars, nanocones, nanowires, inverted pyramids, nanospheres, nanoshells, and nanodomes, have enabled strong, broadband absorption in semiconductors for optoelectronic devices such as photosensors and photovoltaics. Dielectric nanostructures are extremely effective at coupling and directing light across an interface between the outside world and optically active materials owing to a rich set of optical phenomena, including gradual refractive index matching, scattering, and coupling to guided modes. However, in many applications, a nanostructured optical interface must also serve as a conduit for electrical current between the semiconductor and an external circuit. In addition to providing photon management, the interface must offer high electrical conductivity.

Transparent conductive oxides offer the industry standard performance for conductive layers with high optical transparency, but are limited because of low conductivity in the film, slow deposition processes, and ultimately because of material scarcity of some elements in the oxide. A number of alternatives based on metal nanowire networks have emerged, but these are limited to low surface coverage to ensure high coupling through the photon management interface. Extraordinary transmission, i.e., transmission in excess of that predicted by diffraction theory, has been observed in high-surface coverage metal films with subwavelength holes. However, the transmission through these surfaces is generally limited to a narrow range of wavelengths and polarizations of light.

SUMMARY OF THE INVENTION

In one aspect, the present invention provides a new optoelectronic device in which the two important elements of conventional designs, photon management structures and transparent conductors, are united in a single structure that offers performance not possible in traditional designs: an effective optoelectronic interface comprising dielectric nano-element arrays protruding through a conductive metal film, thereby providing a surface with high metal coverage, and thus high conductivity, while allowing coupling of light and absorption into an underlying substrate.

This surprising design represents a fundamentally new paradigm for designing hybrid optoelectronic surfaces where transparent electrodes and photon management nanostructures are integrated into a single interface for maximum performance.

The design lifts the restriction for low metal coverage, allowing structures that have significantly lower sheet resistance values than technology currently available. In one aspect, the structure comprises an array of dielectric resonant elements with an embedded metal film. The metal film is disposed below the top surface of the resonant elements. Owing to leaky resonances within the resonant elements, light is concentrated in each resonator and can couple between the outside world and the substrate through the small volume beneath each resonant element; the metal film is thus virtually invisible to light, allowing designs with extremely high absorption (>90%) and low sheet resistance (<20 Ohm/sq.) despite having extremely high (50% or greater) metal coverage. Electromagnetic simulations show that across a wide range of materials and geometries, leaky Mie resonances in the nanopillars direct electromagnetic energy around the metal film and into the underlying substrate. The hybrid metal-dielectric surface is a unique structure that offers unparalleled performance in applications when a transparent conductor in contact with a high-refractive index medium is needed.

In one aspect, the invention provides an optoelectronic device including a hybrid metal-dielectric optoelectronic interface disposed above an underlying substrate. The hybrid metal-dielectric optoelectronic interface includes i) an array of nanoscale dielectric resonant elements, and ii) a metal film disposed between the dielectric resonant elements and below a top surface of the resonant elements such that the dielectric resonant elements protrude through the metal film.

The dielectric resonant elements preferably have a spacing between $0.1\lambda$ to $10\lambda$, where $\lambda$ is a predetermined central operational wavelength of the device. A width of each of the dielectric resonant elements is preferably between 10% to 90% of the spacing, and each of the dielectric resonant elements protrudes over the metal film preferably by at least $0.05\lambda$. The dielectric resonant elements may be disposed such that they form a photonic crystal slab with a photonic bandgap.

The hybrid metal-dielectric optoelectronic interface and the underlying substrate preferably have an absorption above 90% across a predetermined operational wavelength, e.g., the spectrum from 400 nm to 900 nm.

The device may include an anti-reflection coating on the array of dielectric resonant elements and the metal film. The anti-reflection coating preferably has a thickness in the range from 10 nm to a spacing between adjacent dielectric resonant elements. The anti-reflection coating preferably has an index of refraction intermediate between that of the dielectric resonant elements and that of a predetermined operational environment.

Preferably, at least 30% of an areial surface of the hybrid metal-dielectric optoelectronic interface is covered with the metal film. The hybrid metal-dielectric optoelectronic interface preferably has a sheet resistance of at most 20 Ohm/sq.

The resonant elements may be, for example, nanopillars, nanocones, nanowires, nanopyramids, inverted nanopyramids, nanospheres, nanoshells, or nanodomes.

The metal film is preferably composed of gold, silver, copper, aluminum, rhodium, platinum, palladium, or an alloy or a stack thereof.

The dielectric resonant elements, and the substrate, are preferably composed of silicon, gallium arsenide, gallium nitride, or indium phosphide.

The device may further include a metal film layer on each of the dielectric resonant elements. The metal film layer is preferably composed of gold, silver, copper, aluminum, rhodium, platinum, palladium, or an alloy or a stack thereof.

In one embodiment, the invention provides a prototype of silicon nanopillars protruding from a silicon substrate through a patterned gold film, covered by a silicon nitride anti-reflection coating; despite metal coverage 60% of the top surface of this structure, it can achieve absorption above 97% across a broad band of wavelengths from 400 to 900 nm and low sheet resistance of 16 Ohm/sq.

Further, in some embodiments, the structure is fabricated using metal-assisted chemical etching (MACE). In MACE, a patterned metal in direct contact with a dielectric surface acts as a catalyst for wet etching: the metal sinks into the dielectric as the reaction proceeds and is thus automatically self-aligned to the nanostructure it creates. The MACE process is simple and versatile, and compatible with a number of combinations of metals and optically important semiconductors, including silicon, gallium arsenide, and indium phosphide.

In some embodiments, by tuning the geometry, and thus the optical properties, of the structure, it can be made highly reflective or spectrally selective, and thus suitable for contacts in electrochromic windows, LEDs, and tandem solar cells.

This type of hybrid optoelectronic interface is very versatile and could be used for optoelectronic surface where photon management is required (for example at the front, rear, or some intermediate surface of solar cells, photodetectors, and camera sensors). The hybrid optoelectronic interface may also be used in devices such as photovoltaic cells or light emitting diodes.

BRIEF DESCRIPTION OF THE DRAWINGS

FIGS. 7A-G present fabrication steps, properties, and structure of a silicon nanopillar array with an embedded gold film and thin film top layers on each nanopillar, according to an embodiment of the invention.

DETAILED DESCRIPTION

Figures 1A, 1B:
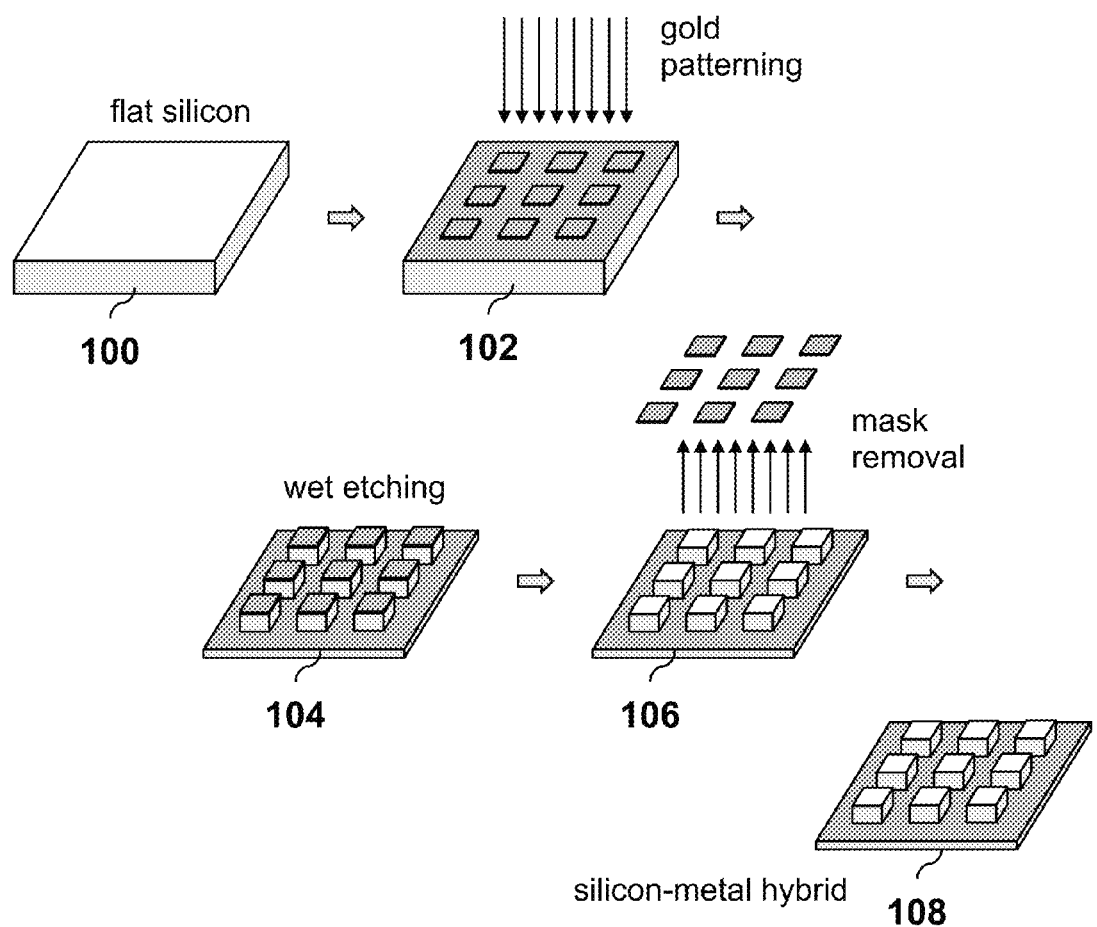
FIGS. 1A-1J present fabrication steps, absorptance graphs, and structure of a highly absorptive silicon nanopillar array with an embedded gold film, according to an embodiment of the invention.

To maximize light coupling or absorption, optoelectronic devices typically contain light management structures of high index materials, either in an active or window layer. These could include micro- and nano-pillars, cones, wires, pyramids and inverted pyramids, spheres, shells, domes, and other geometries. These light management structures improve light coupling through gradual refractive index matching, scattering, coupling to guided modes, and photonic crystal effects.

These light management structures typically sit in close proximity to electrodes in the device which allow for electrical contact. Electrodes can be made of transparent conductors, notably oxides, which offer some conductivity while permitting light transmission through a continuous film of material. Sputtered indium-doped tin oxide (ITO) is the most common transparent conductor currently used; however, sputtering ITO evenly over highly textured surfaces can be challenging, and the thick layers needed for applications that require very low resistance result in long sputtering times, and thus lower device throughput. The minimum resistivity achievable in such electrodes at a given thickness can be a limitation on device performance, and ultimately the material scarcity of elements in the oxide could limit the ubiquitous adoption of this type of electrode. While large scale metal electrical contacts are effective conductors, they introduce loss of optical efficiency into optoelectronic devices by reflecting or parasitically absorbing light in the contact, hindering light coupling or absorption into the active layers of the device. Nanowire meshes, by contrast, take advantage of high conductivity materials, notably metals, while letting light through void spaces in the mesh. However, a fundamental tradeoff between surface coverage and shadow loss limits the transmissivity and sheet resistance that can be achieved. Many studies have shown that the transmission through subwavelength holes in a metal film with higher surface coverage, and thus lower resistance, can be much higher than that which would be expected by considering diffraction from the holes alone. In fact, state of the art designs with 50% metal coverage or more have reported transmission coefficients as high as 50-80% through nanoscale holes at some wavelengths and polarizations. Theoretical models elucidated that surface plasmon resonances in perforated metal films give rise to this extraordinary transmission; in many cases, the electric field intensity above the holes is greatly enhanced, thus allowing more light to propagate through the apertures. However, plasmon-mediated extraordinary transmission is inherently a narrow-band, polarization sensitive phenomenon, and the transmission spectrum is very dependent on the shape and size of the holes in the metal film.

Despite the physical proximity of electrodes and light management elements in real devices and the commensurate length scales of transparent nanowire electrodes and photon management nanostructures, these elements have historically been designed and optimized separately. In particular, the transparency of metal nanowire networks is optimized and measured considering the network in isolation, i.e., suspended in free space or sometimes on a transparent substrate. At real interfaces with nanostructured semiconductors, the profile of the light, and therefore the performance of the network, could differ significantly.

Here, we unify the concepts of a photon management texture and a transparent electrode in a single structure and enable broadband ultra-high transmission through a perforated metal film and thus broadband, ultra-high absorption in an optically active substrate. Our design includes an array of dielectric resonators, e.g., nanopillars, protruding through a metal film. Nanopillars, like many other types of nanostructures like spheres, half-spheres, cylinders, shells, and cones, act as light "funnels" by strongly coupling and confining light into Mie-like resonances that leak into the substrate through the small volume beneath each pillar. Surprisingly, the electric field pattern of light incident on the dielectric nanopillars is not strongly affected by the metal film even if the pillars only protrude a few tens to a few hundred nanometers above the film.

Nanopillars according to embodiments of the invention may be composed of various suitable dielectric materials that have refractive indices higher than the media they are protruding into.

The metal films according to embodiments of the invention may be composed of various suitable conductive metal materials. Preferably, to be suitable for metal-assisted chemical etching, the metals are catalytically active.

As a proof of concept, we devised a simple method for fabricating a silicon nanopillar array protruding through a gold film using metal-assisted chemical etching (MACE). Our process flow illustrating the key steps for fabricating a gold-silicon hybrid structure using MACE is summarized in FIG. 1A. A silicon substrate 100, is patterned with gold to produce a patterned substrate 102, which in turn is wet etched to produce an structure 103. After etching, the mask is removed 106 to produce a silicon-metal hybric structure 108. In the etching step, illustrated in the detailed schematic of FIG. 1B, we immersed an n-type silicon substrate (optically thick, 36-350 μm) covered by a gold film with a patterned array of square holes into a solution of hydrofluoric acid and hydrogen peroxide. In solution the hydrogen peroxide is decomposed to water at the metal surface, and in the process transfers holes to the silicon via the metal. Next, the hole-rich silicon, now in an oxidized state, reacts with the hydrofluoric acid to form the soluble species $H_2SiF_6$ and hydrogen gas. Etching proceeds anisotropically directly beneath the metal, and the metal sinks into the nanostructure, resulting in a dramatic change in the surface structure and optical properties. In the etching step, the silicon directly beneath the gold layer is oxidized and attacked, resulting in the sinking of the metal layer into the substrate.

Figure 1C:
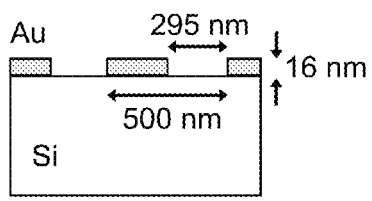
Figure 1D:
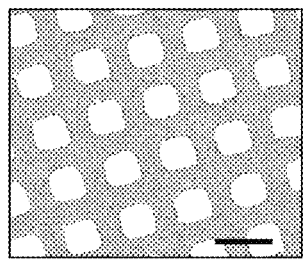
Figure 1E:
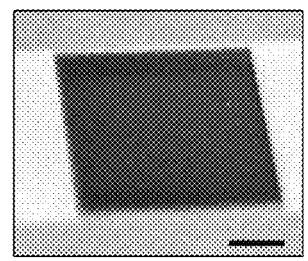
Figure 1F:
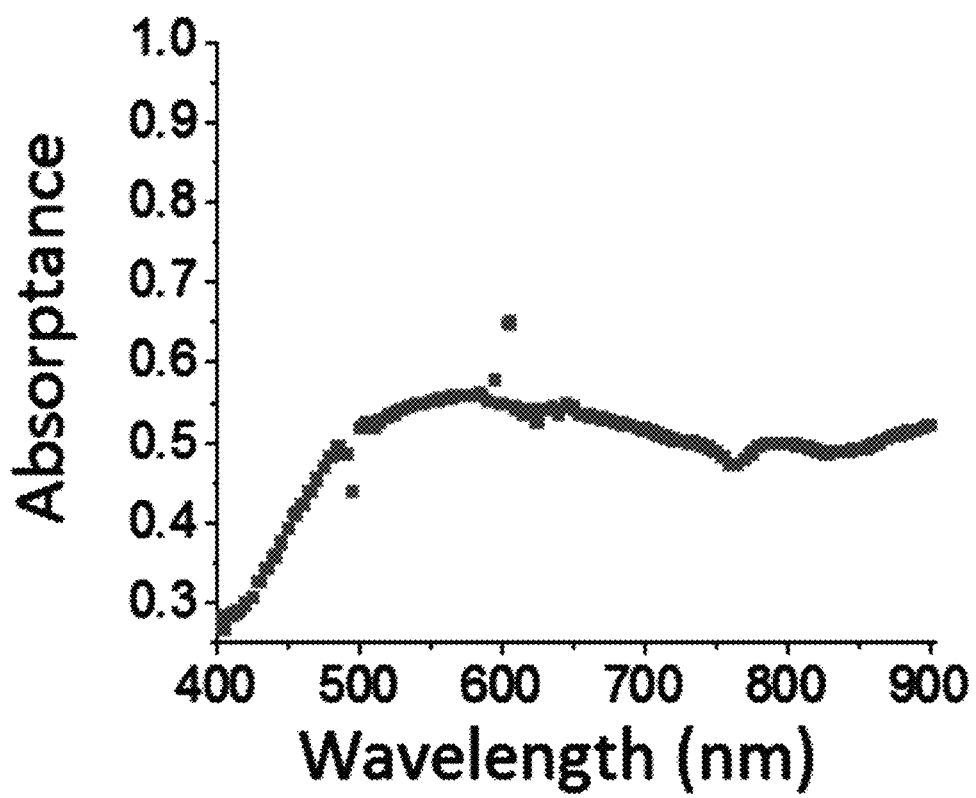
Figure 1G:
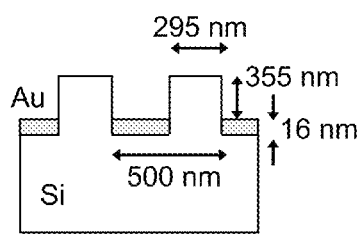
Figure 1H:
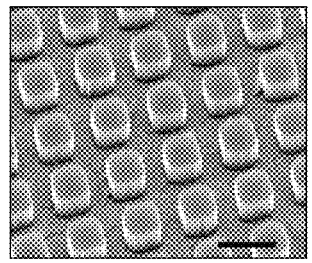
Figure 1I:
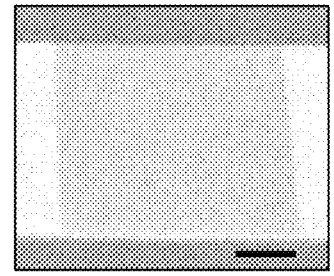
Figure 1J:
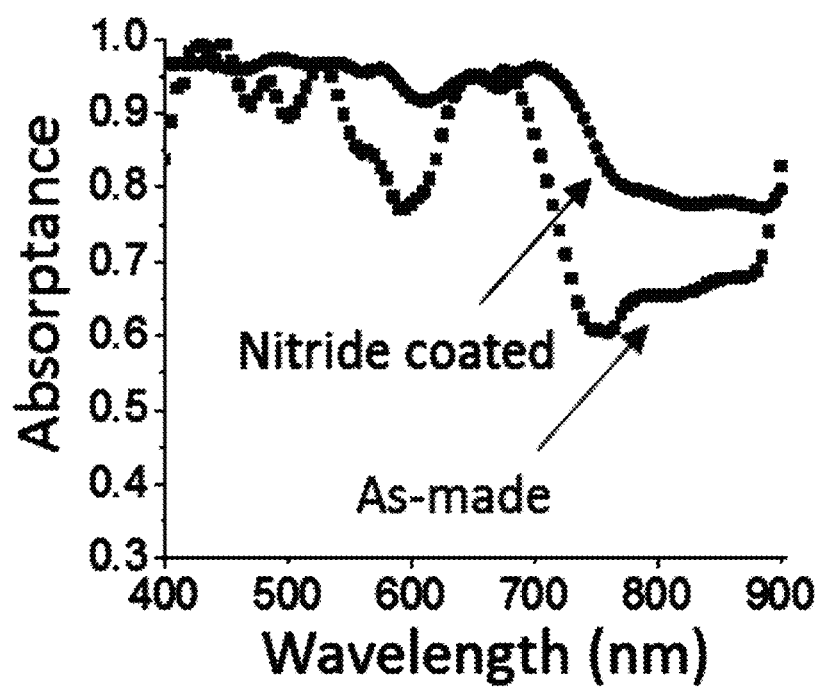

FIG. 1C is a cross-sectional schematic of the unetched structure, including relevant dimensions. FIG. 1D is a 25° tilt-view SEM micrograph of the unetched structure (scale bar 500 nm), and FIG. 1E is a digital photograph (scale bar 1 mm). FIG. 1F is a graph of 5° off-normal absorption spectrum for a 16 nm-thick gold grid sitting atop a silicon substrate (before etching). The surface, which is 65% covered by metal, is highly reflective, showing only 50% integrated absorption across the solar spectrum. FIG. 1G is a cross-sectional schematic of the etched structure, including relevant dimensions. FIG. 1H is a 25° tilt-view SEM micrograph (scale bar 500 nm), and FIG. 1I is a digital photograph (scale bar 1 mm). FIG. 1J is a graph of 5° off-normal absorption spectra for an identical 16 nm-thick gold grid embedded between silicon nanopillars (after etching). The sample's integrated absorption has been boosted to 81% by the etching process and to 90% by etching and coating with a 50 nm silicon nitride layer.

FIGS. 1C and 1D show a schematic cross-section and a scanning electron microscopy (SEM) image, respectively, of the surface structure of a planar silicon substrate covered by a 16 nm-thick gold film patterned with an array of 295 nm×295 nm square holes with a center-to-center spacing of 500 nm. As expected, the surface is highly reflective before etching, as shown in FIG. 1E. The optical absorption spectrum, as shown in FIG. 1F, shows that the surface has only 50% integrated absorption (weighted over the solar spectrum) across the wavelength range of 400 to 900 nm.

More generally, according to embodiments of the invention the pillars are preferably spaced on the order of $\lambda$, the operational wavelength of light (i.e., between $0.1\lambda$ to $10\lambda$), the pillar width (i.e., array hole diameter) is preferably between 10% to 90% of the spacing, with the optimum width being around 40-50% of the spacing, and the pillar height is preferably selected such that the pillar protrudes over the thickness of the film by at least $0.05\lambda$, where $\lambda$ is the operational wavelength of the device. The ranges for achieving high (>90%) transmission/absorption are very wide, particularly when an anti-reflection layer is applied overtop of the structure. Also, periodicity in the arrangement of pillars is not strictly required, so the array does not necessarily need to have regular spacing to achieve this performance. Thus, in some embodiments, the pillar arrangement is not periodic, e.g., a random spacing or orderly spacing by different amounts.

FIGS. 1G and 1H show the same structure as FIGS. 1C and 1D after metal-assisted chemical etching. The gold film has sunk into the area between the bases of an array of nanopillars protruding 355 nm above the surface. (More generally, in other embodiments, the nanopillars protrude by a distance in the range 10 nm to 5000 nm.) Very interestingly, the patterned area in the etched sample is a deep red color, indicating significant reduction of optical reflection. The absorption spectrum, shown in FIG. 1J, confirms that this etched sample is absorbing 81% of the light across the visible spectrum, more than 60% more light than the unetched surface with a metal film on top. FIG. 1J also shows that by adding a 50 nm-thick silicon nitride anti-reflection coating, the integrated absorption increases further, to 90%. (More generally, in other embodiments, the anti-reflection coating may have a thickness in the range from 10 nm to the distance between adjacent pillars.) Considering that the gold film occupies 65% of the top surface, the broadband low reflectance and high absorption is surprising. Previous studies have shown only modest narrowband plasmon-mediated transmission through high surface coverage metal films, unlike the strong, broadband transmission through the metal observed here.

The structure we have created and the process we have designed to fabricate it are very versatile. The metal grid is automatically self-registered to the nanopillar array, so no subsequent patterning or alignment is required after the formation of the photon management structure. MACE can be used to etch many metal-semiconductor systems, including single crystal and polycrystalline silicon and III-V substrates using aluminum, silver, platinum, palladium, rhodium, and gold catalysts. Moreover, all processing occurs at low temperatures, below 90° C. Finally, the dramatic optical change associated with etching could be useful for endpoint detection or monitoring process uniformity.

Figure 2A:
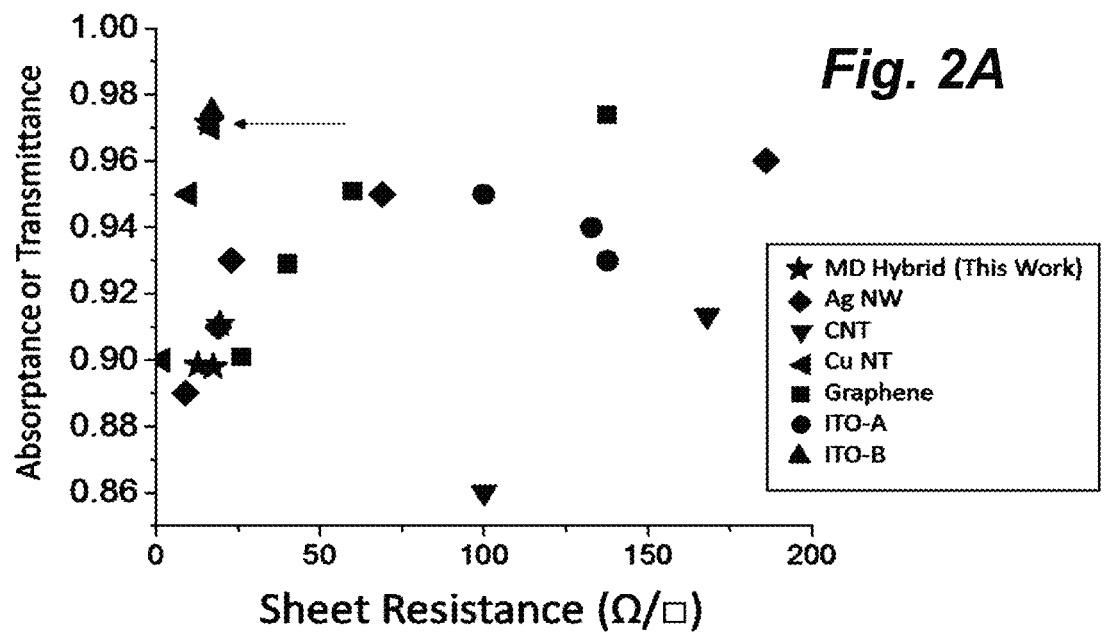
FIGS. 2A-D present graphs of optical and electrical characterization of gold-silicon hybrid optoelectronic interfaces, according to an embodiment of the invention.

Next, we fabricated four samples, varying the width of the gold lines and the etching time to produce gold/silicon nanopillar hybrid surfaces with different metal line widths and different etching times, resulting in different pillar geometries and heights. In FIG. 2A, we plot the sheet resistance and integrated absorption (weighted over the solar spectrum from 400 to 900 nm) of our structures and compare them to reported values of sheet resistance and transmittance of other transparent electrodes from the literature, which is valid in the limit where the transparent electrodes from the literature are placed atop perfectly absorbing substrates and where the metal losses in our structure are negligible (a finding we validate later using electromagnetic simulations).

Figure 2B:
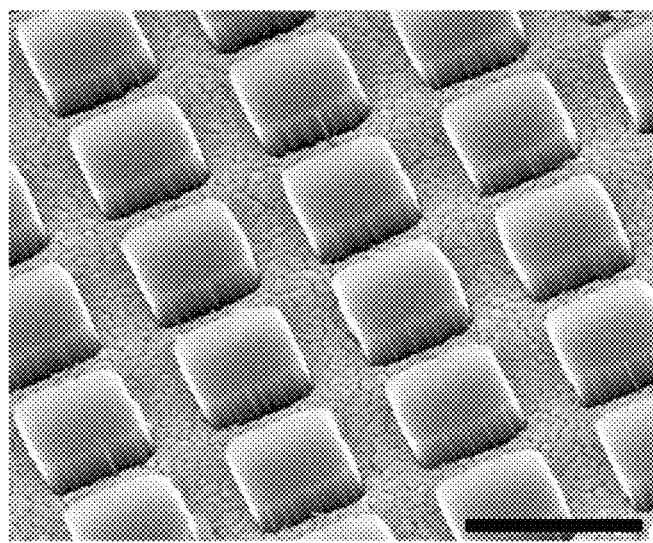
Figure 2C:
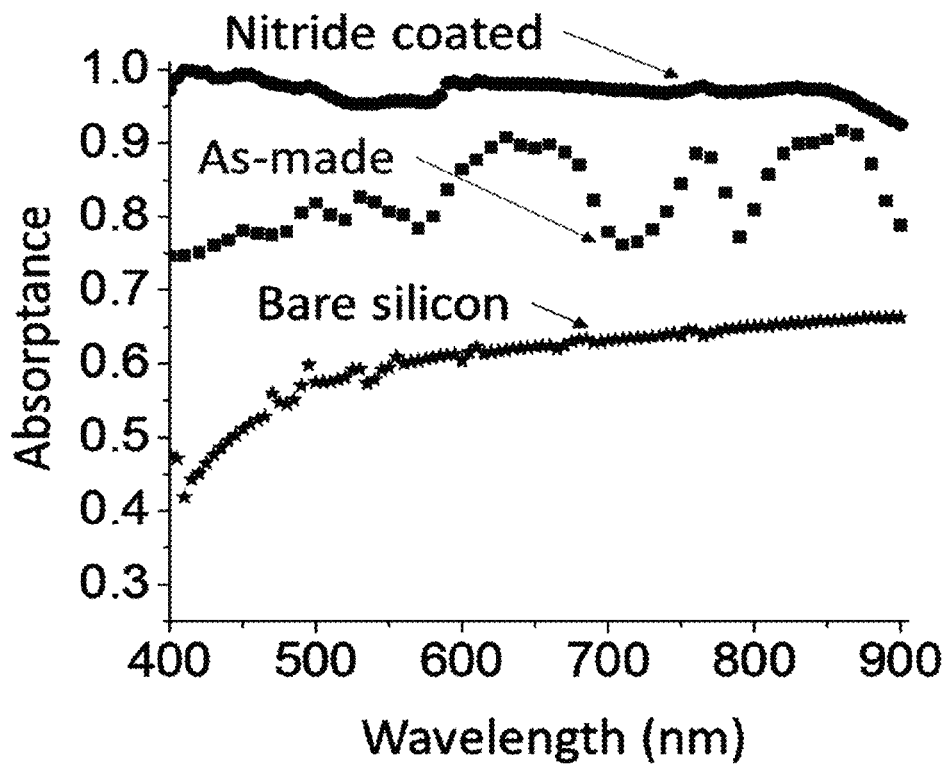
Figure 2D:
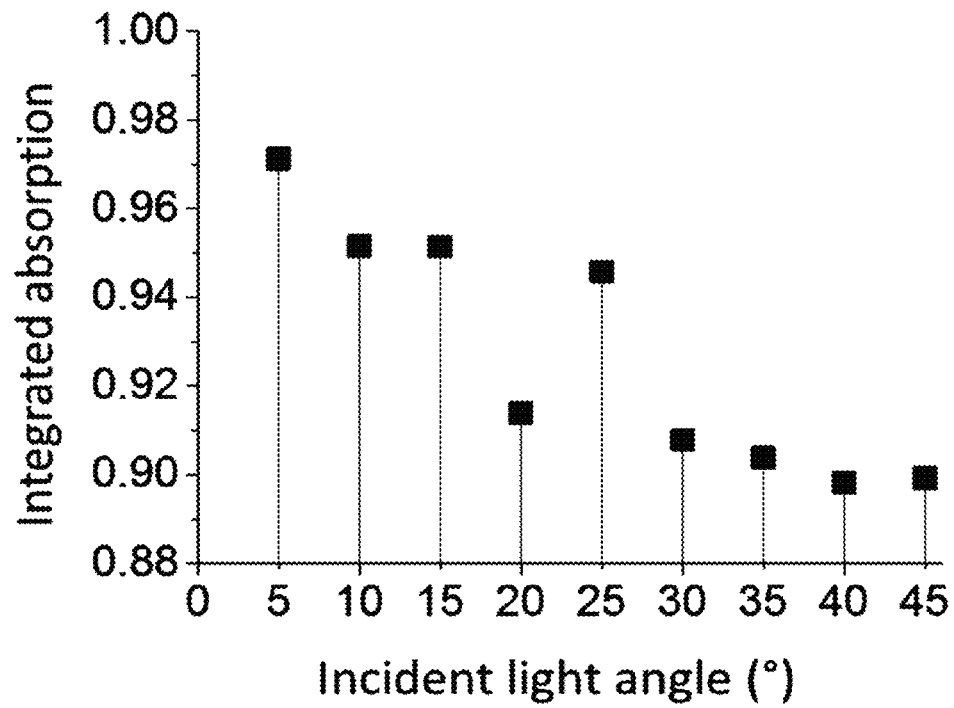

FIGS. 2B, 2C, 2D show an electron micrograph, the 5° off-normal incidence absorption spectrum, and integrated absorption as a function of angle, respectively, for our best performing design. This structure has pillars that are 320 nm wide by 150 nm tall with a 500 nm center-to-center spacing. Remarkably, with a 50 nm silicon nitride anti-reflection layer, the structure has an integrated absorption of 97% and a sheet resistance of 16 Ω/sq., which is on par with some of the best transparent electrodes on record. Further, absorption above 90% is preserved even to angles of incidence as high as 40°. Amazingly, despite the fact that 60% of the aerial surface of the gold-silicon hybrid is covered with metal, the structure demonstrates strong, broadband absorption across 400 nm to 900 nm (which includes the visible spectrum) and at a variety of angles of incidence.

FIG. 2A is a comparison of the absorption and sheet resistance of the four gold-silicon hybrid optoelectronic interfaces fabricated in this work to the transmittance and sheet resistance of other transparent electrodes, namely silver nanowires, carbon nanotubes, copper nanotroughs, graphene, and indium-doped tin oxide films. Owing to high metal surface coverage, our hybrid surfaces are clustered in the regime of low sheet resistance on this plot, with the best sample being on par with the highest absorption values reported in the literature, assuming placement of the electrodes on perfectly absorbing substrates. FIG. 2B is a tilt-view SEM micrograph (scale bar 500 nm) of the structure indicated by the arrow in FIG. 2A. For this sample, the nanopillars are 320 nm wide with a 500 nm center-to-center spacing and protrude 150 nm from the 16 nm-thick metal film. FIG. 2C is a 5° off-normal absorption spectrum for bare silicon, the as-made gold-silicon nanopillar surface shown in FIG. 2B, and the gold-silicon nanopillar surface shown in FIG. 2B with a 50 nm silicon nitride coating. FIG. 2D is a standard hemispherical reference solar spectrum-integrated absorption of the gold-silicon hybrid surface with a 50 nm silicon nitride coating as a function of incident light angle.

Figure 3A:
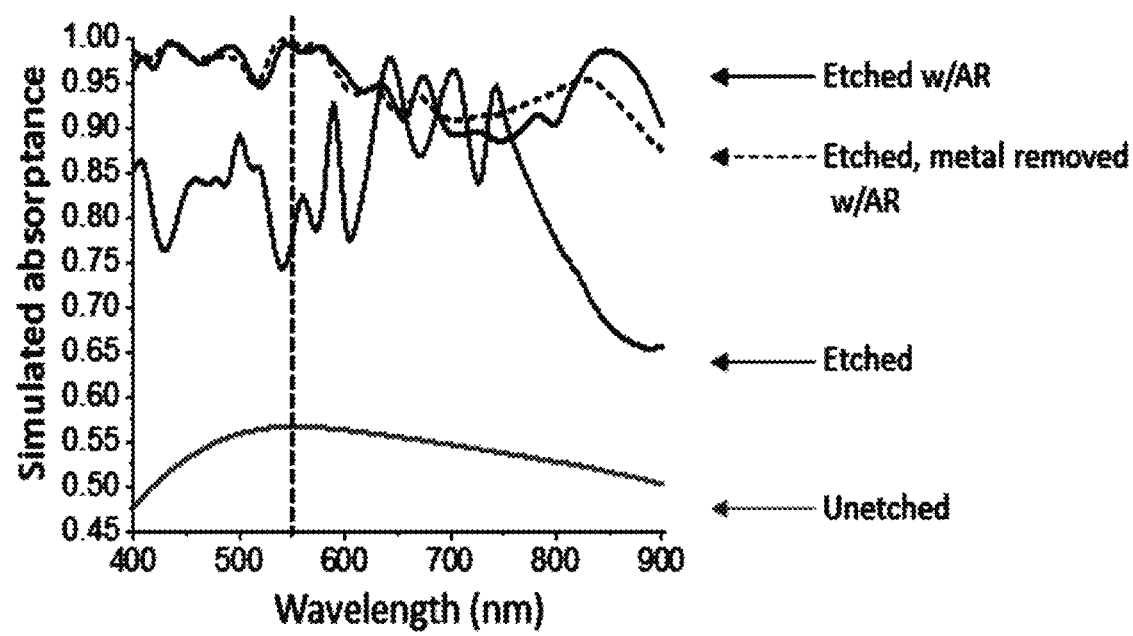
FIGS. 3A-C present results of frequency modal method optical simulations of a gold-silicon hybrid optoelectronic interface showing leaky Mie-like resonances, according to an embodiment of the invention.

We next performed detailed simulations of a model of our structure using a freely available frequency modal method software package. FIG. 3A shows the simulated absorption spectra for a silicon substrate with a metal film with 300 nm-wide holes on a 500 nm spacing with a 15 nm-thick gold layer before and after etching. The etched surface (with 330 nm-tall nanopillars) demonstrates much stronger simulated absorption than the unetched surface across the visible spectrum, confirming our experimental observations. Moreover, FIG. 3A also shows simulated absorptance spectra for a structure coated with a 50 nm silicon nitride layer, both with and without the embedded metal film.

The difference in absorption is negligible (±2%), suggesting, as hypothesized, that parasitic absorption and shadow losses from the metal are not a dominant loss mode in this architecture.

Figure 3B:
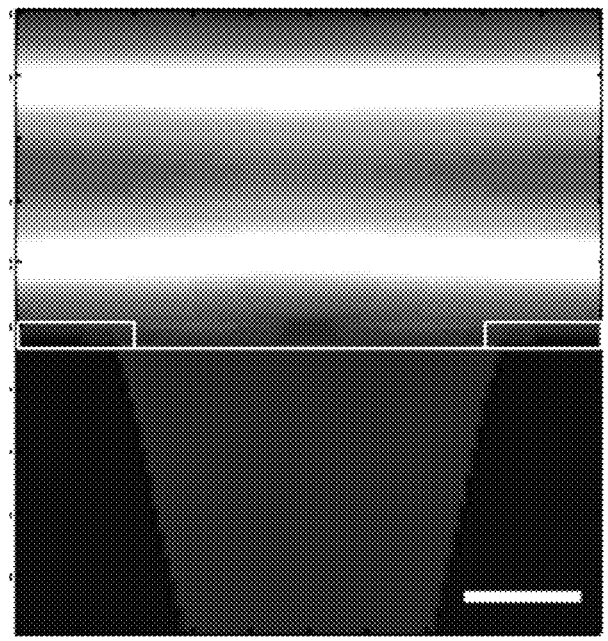
Figure 3C:
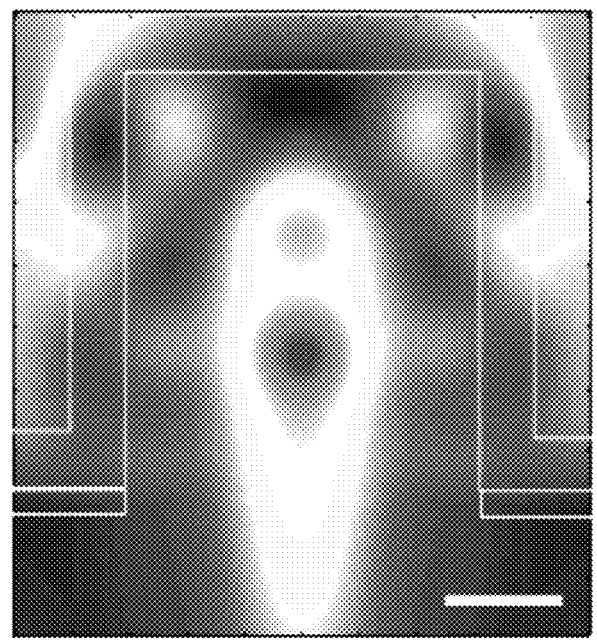

The simulated field patterns of the unetched structure and the etched structure with a nitride coating at an incident wavelength of 550 nm are shown in FIGS. 3B and 3C, respectively. While the patterned metal film at the unetched surface strongly reflects incoming light, the etched structure confines light within a Mie-like resonance in the pillar that leaks into the substrate, as predicted.

FIGS. 3A-C show detailed frequency modal method optical simulations of a gold-silicon hybrid optoelectronic interface showing leaky Mie-like resonances. FIG. 3A is a graph of simulated normal incidence absorption as a function of wavelength for the metal film sitting atop a planar silicon surface (unetched), the gold-silicon nanopillar structure (etched), the gold-silicon nanopillar structure with a 50 nm silicon nitride coating (etched w/AR), and a gold-free silicon nanopillar array with a 50 nm silicon nitride coating (etched, metal removed w/AR). The metal film has 300 nm×300 nm holes on a 500 nm spacing, and the gold is 15 nm thick. The nanopillars also measure 300 nm×300 nm and protrude 330 nm above the metal film. As observed experimentally, the etched surfaces demonstrate lower reflection and higher absorption than the unetched surfaces, and the effect of the metal layer on the absorption spectrum is negligible. FIG. 3B is a cross section of the simulated electric field intensity with 550 nm incident light for the unetched metal film sitting atop a planar silicon surface (scale bar 100 nm). Silicon and gold outlines are shown for clarity. Light is strongly reflected from the unetched surface. FIG. 3C is a cross-section of the simulated electric field intensity with 550 nm incident light for the etched gold-silicon hybrid with a silicon nitride coating (scale bar 100 nm). Silicon, gold, and nitride outlines are shown for clarity. A Mie-like resonance confines light inside the pillar, and the light leaks from the pillar into the substrate.

Figure 6:
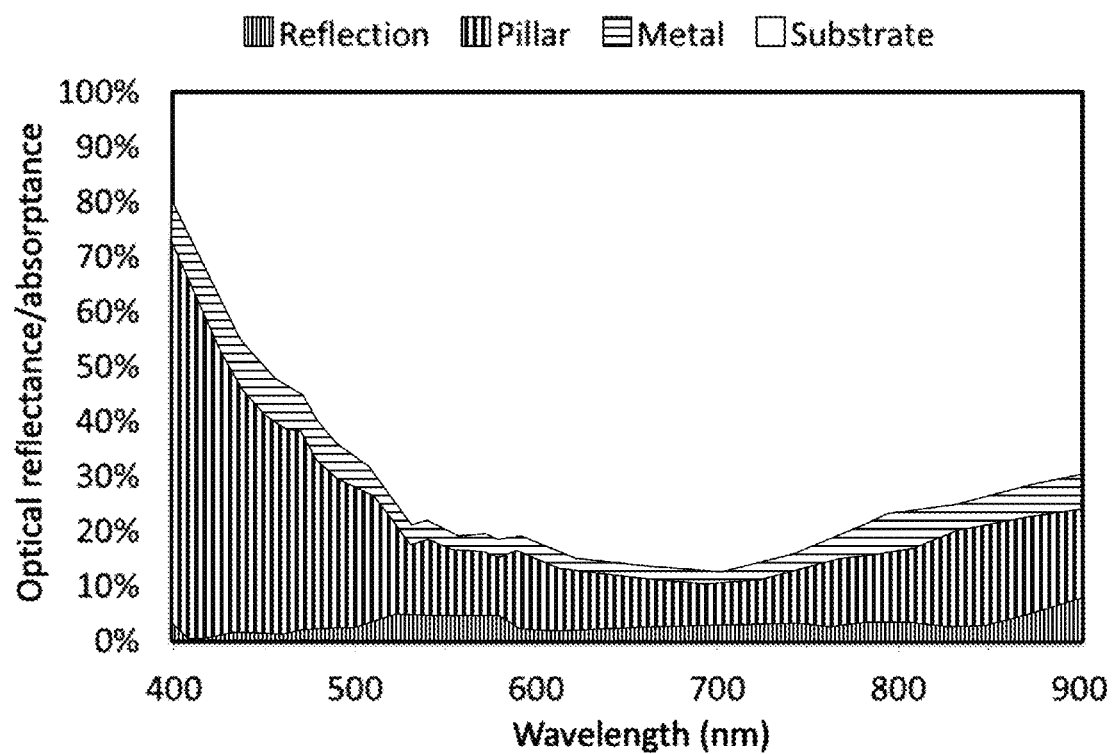
FIG. 6 is a simulated spectrum for a fabricated gold-silicon hybrid structure, according to an embodiment of the invention.

We performed more detailed simulations to determine the fraction of incoming light we expect to be absorbed in the pillars, metal, and substrate. For example, the simulated spectrum for the best performing gold-silicon hybrid structure we fabricated is shown in FIG. 6.

As expected, at short wavelengths, the majority of the light is absorbed close to the surface (in the pillars), while the substrate absorbs the majority of the light at longer wavelengths. It has been shown that nanostructured optoelectronic devices can be optimized to have minority carrier diffusion lengths on the order of microns to tens of microns, which is much larger than the pillar height of 150 nm. Absorption in the pillars, which indeed occurs across the operating range of wavelengths by design in this embodiment, would therefore have a minor impact on efficiency. This is another advantage of the present design; absorption in the nano-elements is not parasitic, and most of the electromagnetic energy in the system is directed through the elements. Reduction of both parasitic absorption and reflection losses is an important differentiator of the present invention over other technologies, including extraordinary transmission interfaces, which are primarily concerned with transmissivity.

We performed further simulations to explore the performance of metal-dielectric hybrids with different geometries and materials, as shown in FIGS. 4A-F. This analysis provided a number of interesting insights. First, integrated absorption above 90% is possible even with metal layers up to 50 nm thick, suggesting that etching with thicker metal layers should be explored. Interestingly, while a metal grid that is just barely embedded in the silicon surface still produces strong reflections, a pillar array that protrudes even 50 to 100 nm above the metal is sufficient to greatly suppress reflection at wavelengths below 600 nm. Simulations of the width and spacing of the pillars showed that the optimal absorption values correspond to resonator arrays with fill fractions of less than 50%. Further, high absorption from metal-dielectric hybrid interfaces is expected in a number of other optical material systems, including gallium arsenide and indium phosphide.

While the specific spectral features in each absorption spectrum generally shift with increasing size in any dimension, these simulations show that high absorption from metal-dielectric hybrid surfaces is possible across a variety of geometries and materials. Preferably, the geometry is such that a majority of the electromagnetic energy in the modal profile of the resonances in the dielectric resonators lies outside the area covered by the metal. Generally, the materials of the pillars and film are such that they provide dielectric index contrast between the nanoscale resonators and the medium into which they protrude.

The wide parameter space over which improved absorption is observed in our experiments and simulations suggests that the metal-dielectric structure could tolerate polydispersity in the nanopillar geometry, making random patterning of the metal layer, for example by nanosphere lithography or metal dewetting, a viable option. In addition, by tuning the pattern of the metal grid, and thus the photonic properties of the resonators, the architecture could be useful not only for high absorption/coupling but also for high reflection, for example as an intermediate reflector in a tandem solar cell and as a light-extracting structure for LEDs. For example, if the nano-elements are disposed such that they create a photonic crystal slab with a partial photonic bandgap that overlaps with the operating wavelength, strong reflection through the photonic bandgap may be observed. The appropriate spacing of the elements may be calculated using optics software to devise a structure with a photonic bandgap to achieve ultra-reflectivity and high conductivity.

While we have described nano-elements consisting of nanopillars so far, a number of other nanoelements could be used instead, including nanocones, nanowires, nanopyramids, inverted nanopyramids, nanospheres, nanoshells, or nanodomes. These structures can be fabricated, for example, by using well-known nanofabrication techniques described extensively in the scientific literature, including crystallographic wet chemical etching to create pyramids and inverted pyramids, self-assembly techniques to align nanospheres, lithography and dry-etching to create nanocones and nanowires, vapor-liquid-solid or chemical vapor deposition to create nanowires, nanoshells, and nanodomes. Leaky Mie-like resonances have been observed in all of these types of structures, and thus any of them could be designed to have appropriate resonances to enable broadband coupling and absorption in a hybrid metal-semiconductor device. Using standard lithography techniques, including metal liftoff and etching, metal could be aligned in between these elements, as required.

In sum, using a simple, rapid fabrication process, we have created a new class of hybrid metal-dielectric optoelectronic interface that unifies a high surface coverage transparent metal electrode and a nanopillar array for photon management. Our best structure demonstrated over 97% integrated absorption from 400 nm to 900 nm and 16 Ω/sq. sheet resistance, competitive with many other classes of transparent electrodes. The leaky Mie resonance mechanism for funneling light past the metal film in this hybrid structure is universal across a broad parameter space of geometries and materials, suggesting a new paradigm for hybrid photon and electron management nanostructures wherein the limitation of low surface coverage for metal nanowire networks is lifted.

Generally, embodiments of the invention may be designed with a variety of different operational wavelengths. Owing to the well-known scale invariance of Maxwell's electromagnetic equations, multiplying the desired operations wavelength, the spacing, and the height of the structure disclosed herein by some common factor and selecting materials such that the dielectric constants remain the same at the scaled operational wavelength would enable broadband transmission through any part of the electromagnetic spectrum from the microwave to the ultraviolet.

Figure 4A:
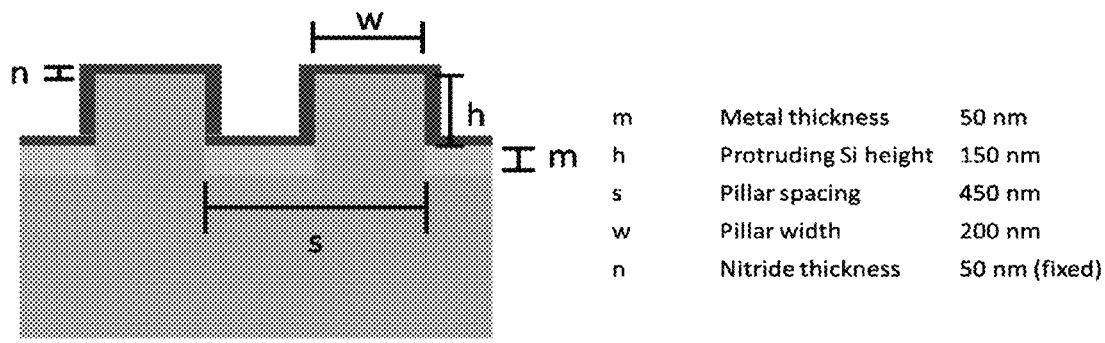
FIGS. 4A-F present simulated absorption spectra of metal-dielectric hybrid surfaces with different geometric and material parameters, according to an embodiment of the invention.
Figure 4B:
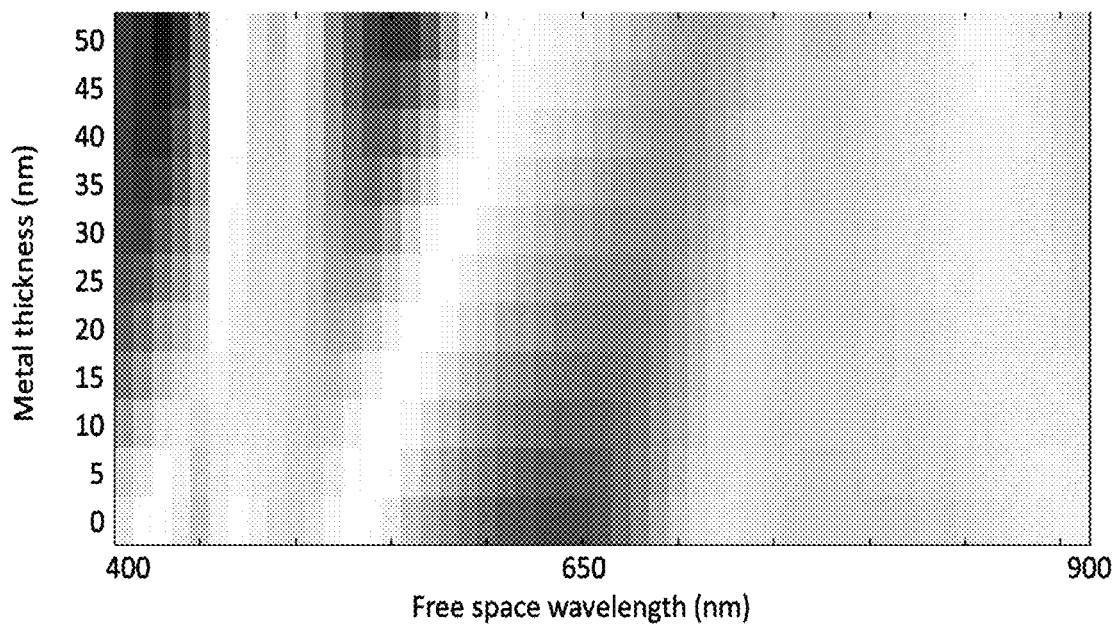
Figure 4C:
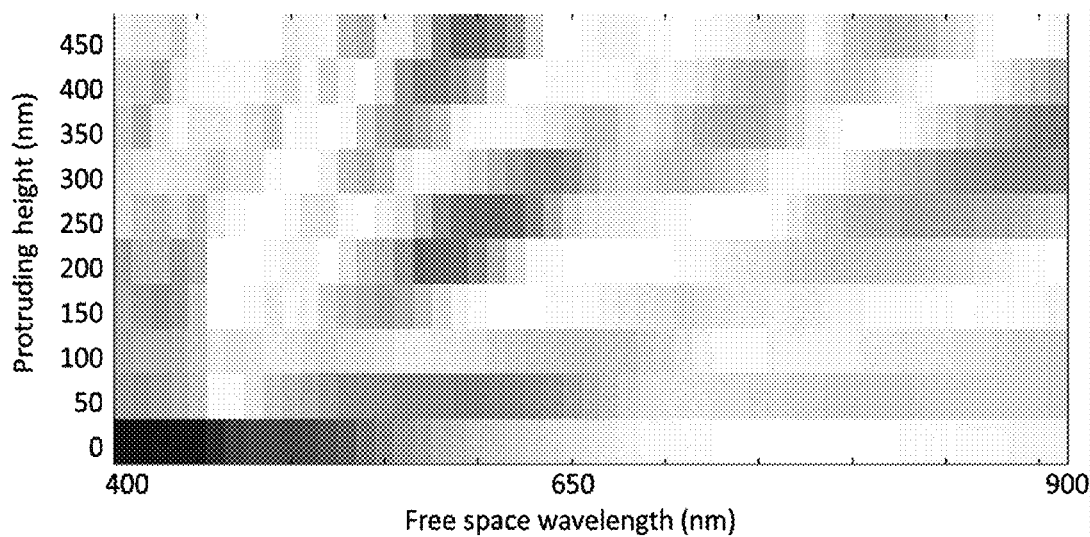
Figure 4D:
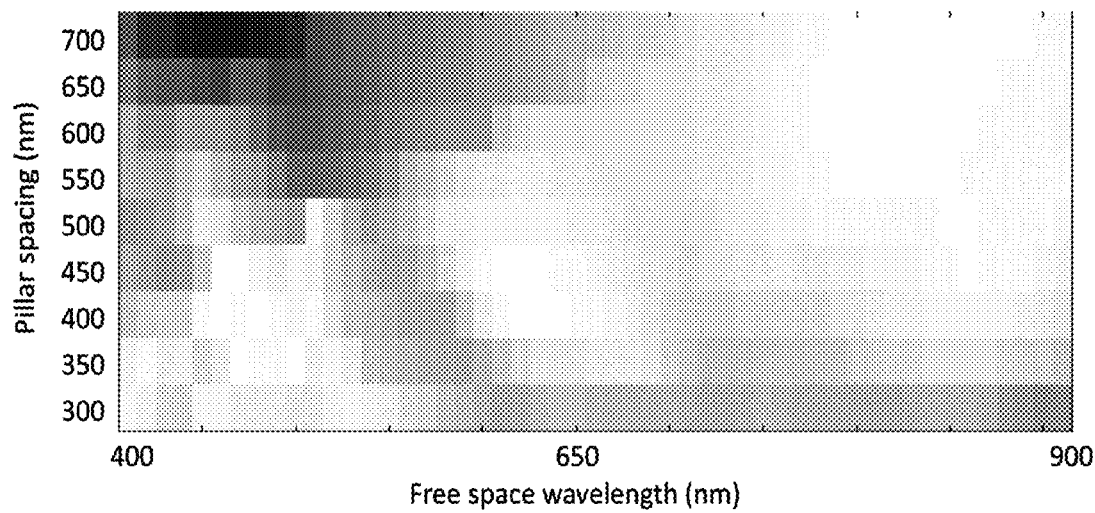
Figure 4E:
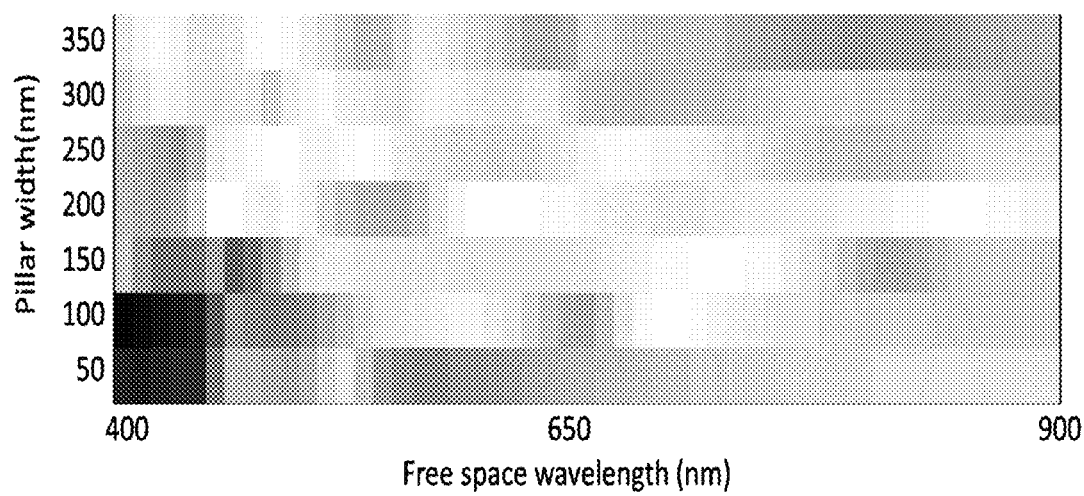
Figure 4F:
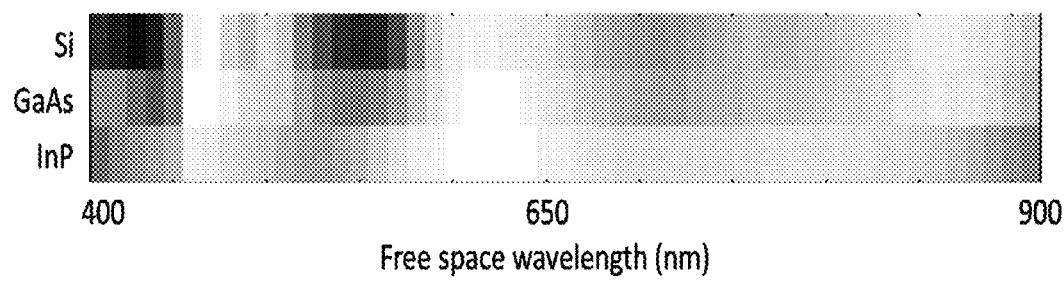

FIGS. 4A-F show simulated absorption spectra of metal-dielectric hybrid surfaces with different geometric and material parameters. FIG. 4A is a schematic cross-section showing the parameters varied in the simulation and their default values. Simulated normal-incidence absorption spectra are shown from 400 to 900 nm are shown in FIGS. 4B-F with varying metal thickness (FIG. 4B), nanopillar height protruding above the metal film (FIG. 4C), nanopillar center-to-center spacing (FIG. 4D), nanopillar width (FIG. 4E), and substrate material (FIG. 4F). While spectral features in the absorption spectra shift as each dimension of the structure changes, high absorption is preserved across a broad range of geometries and materials.

Figure 5:
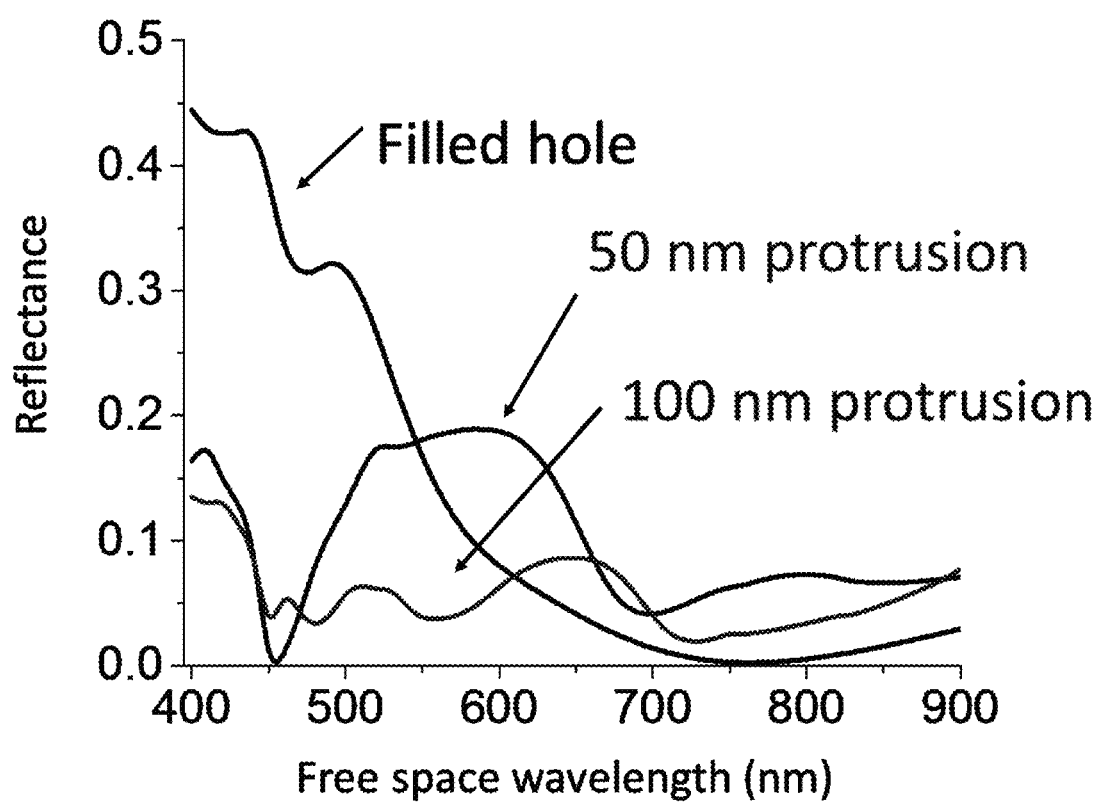
FIG. 5 is a graph showing the effect of the nanopillar height on simulated reflection, according to an embodiment of the invention.

FIG. 5 shows the effect of the nanopillar height on simulated reflection. The short-wavelength reflectance from a metal mesh with silicon filling its holes is still significant, whereas reflection drops significantly if the silicon protrudes as little as 50 to 100 nm above the metal surface. For these simulations, we assumed 200 nm square holes with a 450 nm center-to-center spacing in a 50 nm thick metal film. All structures were assumed to be covered with a 50 nm thick silicon nitride coating.

To fabricate the structure, we started with silicon substrates (n-type, 1-10 Ωcm, 36-350 μm thick). We removed the native oxide by immersion in a 2% hydrofluoric acid solution. We then diluted ma-N 2405 negative-tone electron beam lithography resist (Micro Resist Technology) 1:1 with mr-T 1090 thinner (Micro Resist Technology) and spin-coated it onto the silicon pieces at 4000 RPM for 40 seconds. After spin coating, we baked the sample on a hotplate at 90° C. for one minute and exposed an array of square areas with a dose of 240 μC/cm$^2$ in a JEOL JBX-6400FS electron-beam lithography system with a 100 keV beam energy. We developed the pattern by immersion in Microposit MF-319 (DOW Chemical) for 30 seconds, followed by an isopropanol rinse and drying with a nitrogen gun.

We next prepared the sample for wet etching by cleaning it in an RF plasma system for 10 seconds (Plasma-Prep, 2% $O_2$ and 98% Ar) to de-scum the resist and leave the surface of the silicon oxygen-terminated. We evaporated a nanoporous gold film 16 nm thick onto the sample at 0.5 Å/s in a Kurt J. Lesker LAB 18 electron-beam evaporator system. We then immersed the patterned, metalized thin silicon piece into a solution of hydrofluoric acid (12.04 M) and hydrogen peroxide (0.82 M) for 6-10 seconds. We rinsed the samples with deionized water after etching. We then removed the resist using heated N-methyl pyrrolidone and heated acetone, sometimes with gentle sonication. For some samples, we used a PlasmaTherm Versaline high-density plasma enhanced chemical vapor deposition system to perform a low temperature (90° C.) deposition of silicon nitride.

Optical Measurements

We used an integrating sphere setup (painted with Spectraflect paint) with a white light source and monochromator to measure the specular and diffuse reflection spectra (R) of the gold-silicon surfaces at different angles of incidence. Transmittance through the sample is negligible, so the absorptance (A) can be calculated as A=1−R.

Electrical Measurements

Our structure included two large gold pads electrically connected to each side of the patterned metal film. We applied a conductive adhesive to each pad and used a two-point probe measurement to measure the resistance (R) of the sample. The sample size was measured in an optical microscope, and the sheet resistance ($R_s$) was calculated using the expression $R_s=R \times W/L$, where W and L are the width of the pads and the distance between the pads, respectively.

Optical Simulations

We conducted electromagnetic simulations using a free frequency modal method solver. We used standard refractive index values for the metals, silicon nitride, and the semiconductors (Si, GaAs, and InP). We used 24 spatial frequency modes in most simulations to calculate the fields in our structure with enough resolution. In some cases, we increased the number of modes to 37. Data points were taken at wavelengths 10 nm apart from 400 nm to 900 nm. Fields were extracted on a 5 nm grid spacing.

FIGS. 7A-G illustrate another embodiment of the design for the nanophotonic metal-dielectric hybrid surface. This embodiment has the same structure as the embodiment of FIGS. 1A-J, with the addition of metal on top of the nano pillars embedded in the metal film. One example geometry is shown schematically in FIG. 7A, with electric field cross-section (averaged from 400 nm-900 nm wavelength light illumination) shown in the graph of FIG. 7B. As shown, the electric field has lower intensity in the regions where the metal film is, on top and around the nano pillar. The electric field intensity is concentrated into the nano pillar, allowing extremely high absorption of radiation by the semiconductor material despite the coverage by the metal.

Unlike the structure of the other embodiment, this nano pillar geometry excites a secondary Mie resonance mode, whose features allow the positioning of a metal film also on top of the nano pillar without significant loss of antireflection.

Figure 7C:
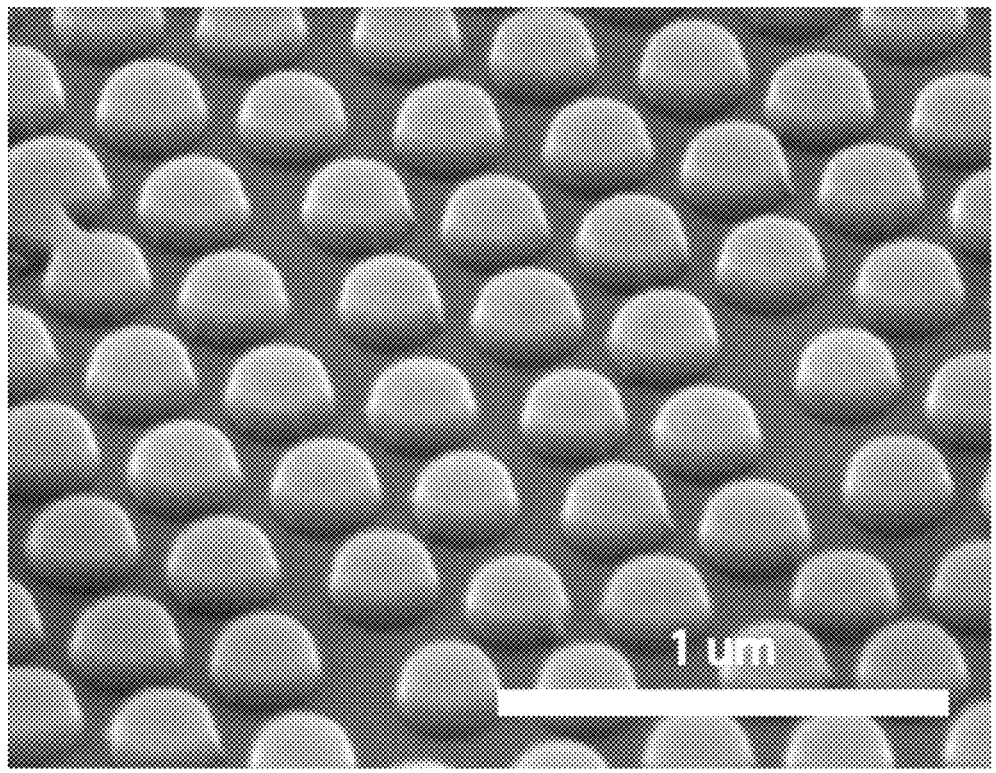
Figure 7D:
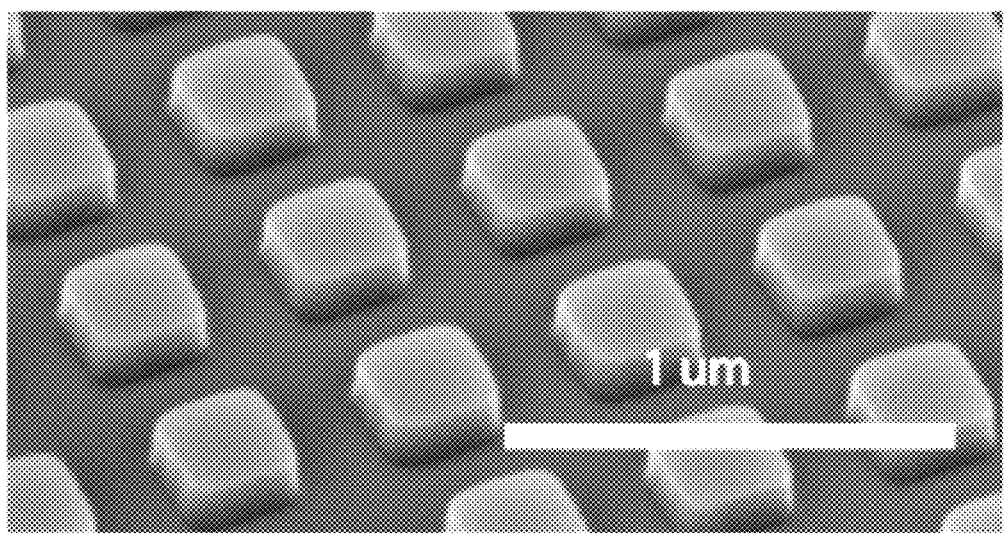

We have demonstrated that this structure can be fabricated with nano sphere lithography as shown in the micrograph of FIG. 7C or with electron beam lithography as shown in the micrograph of FIG. 7D.

The benefit of this structure is that metal can be simply evaporated via physical vapor deposition methods over the nano pillar surface once it is fabricated, yielding a more flexible material choice for the metal film.

Figure 7E:
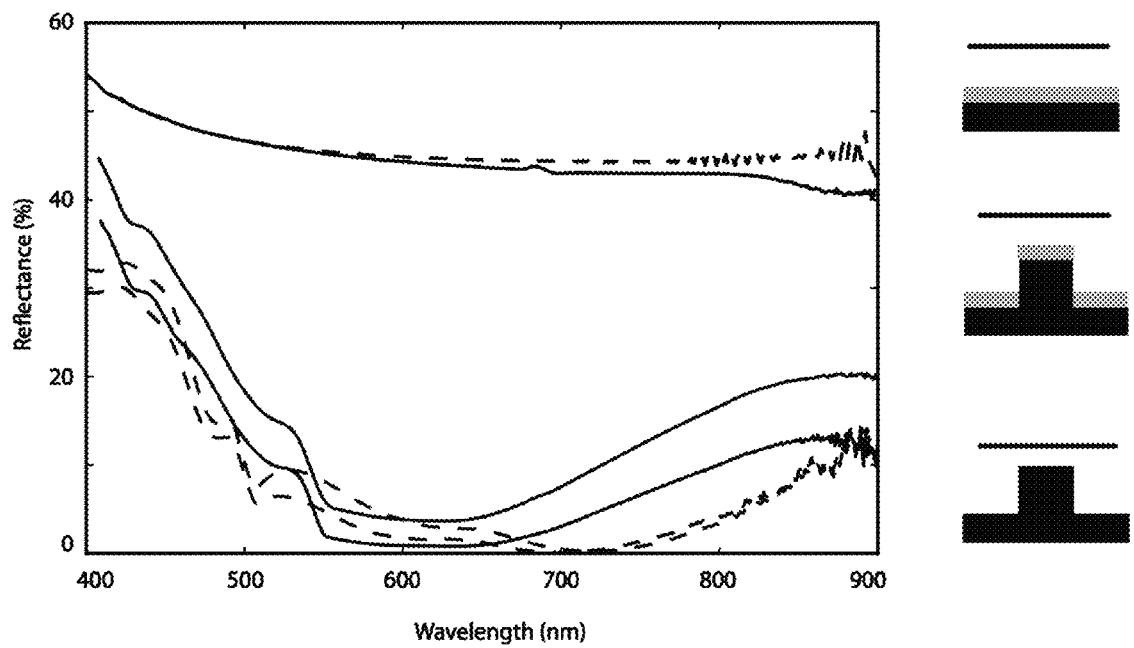

FIG. 7E is a graph comparing experimental data (solid lines) and simulations (dotted lines) of the optical reflectance of the exemplary sample in three different configurations. The nano pillar geometry greatly enhances antireflective property of the surface (bottom), while addition of a 5 nm Pt layer deposited over the entire surface (middle) does not significantly increase reflectance. On the other hand, a 5 nm Pt layer over a flat Si surface (top) has significant reflection across 400 nm to 900 nm wavelength.

Figure 7F:
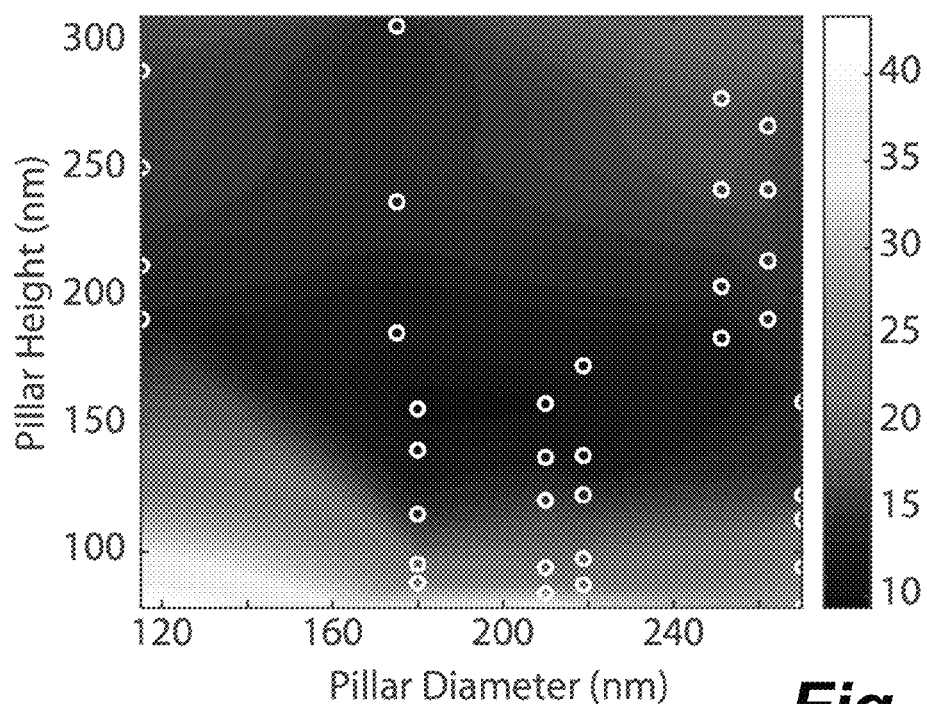
Figure 7G:
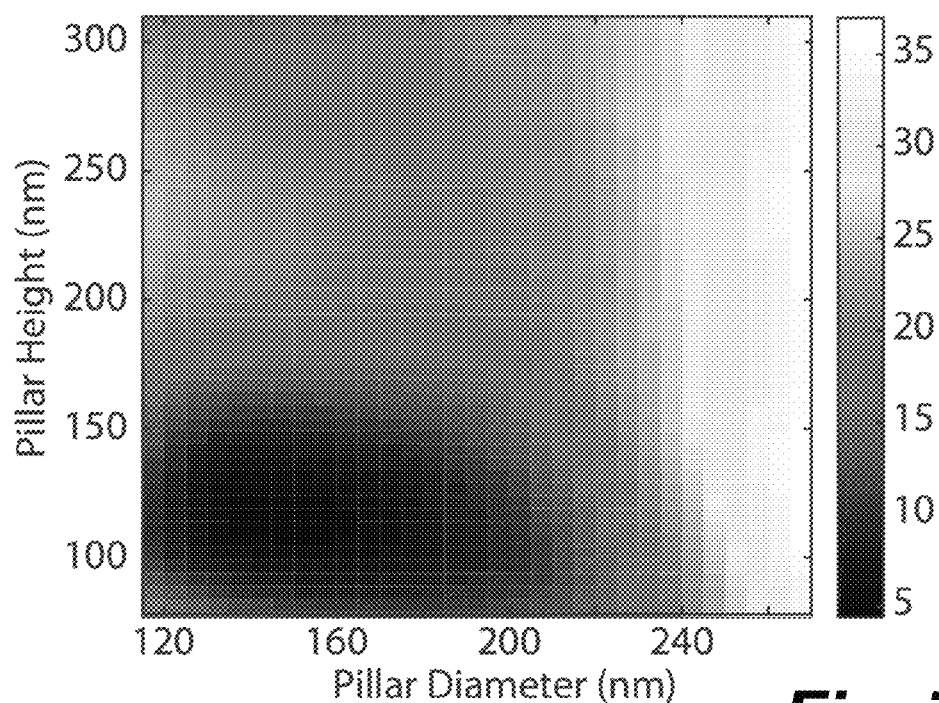

Further, we demonstrate that our simulations are able to accurately capture the overall behavior of the samples with changing the nano pillar geometry. In FIGS. 7F and 7G we show data and simulations, respectively, for nano pillar arrays similar to FIG. 7C, as a function of nano pillar height and nano pillar diameter, with a fixed pitch of 300 nm. In FIG. 7F, we show optical reflectance data averaged from 400 nm to 900 nm (measured at the white circles), interpolated to yield the color plot shown. In FIG. 7G, we show the simulations for this range of geometries. Although the data does not match the simulations perfectly, the overall trend is similar.

The invention claimed is:

1. An optoelectronic device comprising a hybrid metal-dielectric optoelectronic interface disposed above an underlying substrate, wherein the hybrid metal-dielectric optoelectronic interface comprises i) an array of nanoscale dielectric resonant elements, and ii) a metal film disposed between the dielectric resonant elements and below a top surface of the resonant elements such that the dielectric resonant elements protrude through the metal film;

wherein the dielectric resonant elements have a spacing between $0.1\lambda$ to $10\lambda$, where $\lambda$ is a predetermined central operational wavelength of the device, wherein a width of each of the dielectric resonant elements is between 10% to 90% of the spacing, and wherein each of the dielectric resonant elements protrudes over the metal film by at least $0.05\lambda$;

wherein the hybrid metal-dielectric optoelectronic interface and the underlying substrate have an absorption above 90% across a predetermined operational wavelength bandwidth.

2. The device of claim 1 wherein the predetermined operational wavelength bandwidth is the spectrum from 400 nm to 900 nm.

3. The device of claim 1 wherein at least 30% of an areial surface of the hybrid metal-dielectric optoelectronic interface is covered with the metal film.

4. The device of claim 1 wherein the hybrid metal-dielectric optoelectronic interface has a sheet resistance of at most 20 Ohm/sq.

5. The device of claim 1 further comprising iii) an anti-reflection coating on the array of dielectric resonant elements and the metal film; wherein the anti-reflection coating has a thickness in the range from 10 nm to a spacing between adjacent dielectric resonant elements.

6. The device of claim 5 wherein the anti-reflection coating has an index of refraction intermediate between that of the dielectric resonant elements and that of a predetermined operational environment.

7. The device of claim 1 further comprising a metal film layer on each of the dielectric resonant elements.

8. The device of claim 1 wherein the dielectric resonant elements are disposed such that they form a photonic crystal slab with a photonic bandgap.

* * * * *